(12) United States Patent
Kang et al.

(10) Patent No.: US 7,103,493 B2
(45) Date of Patent: Sep. 5, 2006

(54) MEMORY TESTING APPARATUS AND METHOD

(75) Inventors: Ki-Sang Kang, Yongin-si (KR); Tsutomu Akiyama, Musashino (JP); Je-Young Park, Yongin-si (KR)

(73) Assignee: Samsung Electronics Co., LTD, Gyeonggi-do (KR)

( * ) Notice: Subject to any disclaimer, the term of this patent is extended or adjusted under 35 U.S.C. 154(b) by 45 days.

(21) Appl. No.: 10/851,151

(22) Filed: May 24, 2004

(65) Prior Publication Data

US 2005/0043912 A1     Feb. 24, 2005

(30) Foreign Application Priority Data

May 23, 2003     (JP)     .............................. 2003-146319

(51) Int. Cl.
*G01R 31/00*    (2006.01)
(52) U.S. Cl. .................. 702/117; 702/118; 702/119; 702/120; 702/183; 702/185; 702/186; 702/189; 714/718; 365/201
(58) Field of Classification Search ............... 702/111, 702/117, 57–59, 108, 118–120, 183, 185, 702/186, 189; 714/718; 365/201
See application file for complete search history.

(56) References Cited

U.S. PATENT DOCUMENTS

| | | | | |
|---|---|---|---|---|
| 4,414,665 A | * | 11/1983 | Kimura et al. | 714/719 |
| 4,757,503 A | | 7/1988 | Hayes et al. | |
| 4,876,685 A | | 10/1989 | Rich | |
| 5,615,218 A | * | 3/1997 | Tsurumi | 714/743 |
| 5,717,694 A | * | 2/1998 | Ohsawa | 714/704 |
| 5,862,088 A | * | 1/1999 | Takemoto et al. | 365/201 |
| 5,914,964 A | | 6/1999 | Saito et al. | |
| 6,314,536 B1 | * | 11/2001 | Kurosaki | 714/718 |
| 6,425,095 B1 | * | 7/2002 | Yasui | 714/42 |
| 6,560,740 B1 | * | 5/2003 | Zuraski et al. | 714/733 |

FOREIGN PATENT DOCUMENTS

| | | |
|---|---|---|
| EP | 0 828 257 | 3/1998 |
| JP | 09-33645 | 2/1977 |
| JP | 7220499 | 8/1995 |

(Continued)

OTHER PUBLICATIONS

Austrian Patent Office Search Report dated Sep. 30, 2004 in Appl. No. 200402951-8.

*Primary Examiner*—Marc S. Hoff
*Assistant Examiner*—Phuong Huynh
(74) *Attorney, Agent, or Firm*—Harness, Dickey & Pierce, PLC

(57) ABSTRACT

Provided are a memory device testing apparatus and method of operating such an apparatus that can reduce the time required to test a memory device such as a DRAM. The memory testing apparatus includes a pattern generator, a test head, an address pointer, a selector, a failure memory, a failure bit counter and a controller for coordinating the operation of the various elements. Depending on the signals received from the controller, the pattern generator will generate background pattern(s) or test patterns and address information that are, in turn, output to the memory device under test and the selector. During functional testing of the memory device, failure data is accumulated in a failure memory and subsequently output to a failure bit counter using address information from the address pointer while the background or test pattern is being written to the memory device.

20 Claims, 5 Drawing Sheets

FOREIGN PATENT DOCUMENTS

| | | |
|---|---|---|
| JP | 10106293 | 4/1998 |
| JP | 11259374 | 9/1999 |
| JP | 2002162445 | 6/2002 |
| KR | 9405700 | 6/1994 |

* cited by examiner

MEMORY TESTING APPARATUS AND METHOD

CROSS-REFERENCE TO RELATED APPLICATIONS

This application claims priority from Japanese Patent Application No. 2003-146319, which was filed on May 23, 2003, in the Japanese Patent Office, the disclosure of which is incorporated herein in its entirety by reference.

BACKGROUND OF THE INVENTION

1. Field of the Invention

The present invention relates to a memory testing apparatus and testing method in which the test results corresponding to the performance of a memory under test are stored in a failure memory and subsequently counting the failure bits stored in the failure memory, and more particularly, to a memory testing apparatus and method, which can reduce the time required for functional testing of memory devices.

2. Description of the Related Art

Memory testing apparatuses perform tests for various operational parameters of a memory, such as a power supply voltage margin and access time, and count defective bits of the memory. A conventional memory testing apparatus, such as the one disclosed in Japanese Laid-Open Patent Publication No. hei 9-33615, determines whether a memory is eligible to undergo subsequent wafer processing operations based on the number of defective bits detected in the memory. If the number of defective bits detected in the memory exceeds a predetermined number, the memory is determined to be irreparable and is then excluded from subsequent wafer processing operations. If, on the other hand, the memory is determined to be repairable, the memory will be subjected to additional processing during which an attempt to repair the memory will be included. A conventional memory testing apparatus will now be described more fully with reference to FIG. 1.

FIG. 1 is a block diagram of according to one example of a conventional memory testing apparatus. As illustrated in FIG. 1, a test head 1 is electrically connected to a memory 10 to be tested (hereinafter, referred to as a device under test (DUT)) for transmitting/receiving signals to/from the DUT 10. The test head 1 includes a format controller FC, a driver D, a comparator C, and a digital comparator DC. The format controller FC reshapes a pattern input thereto and outputs the reshaped pattern to the driver D. The driver D receives the reshaped pattern from the format controller FC and adjusts or sets the desired voltage level, and outputs the adjusted pattern to the DUT 10. The comparator C receives the output from the DUT 10 and checks the voltage level of the output signal. The digital comparator DC compares outputs received by the comparator C with expected pattern data received from the pattern generator to determine whether the DUT 10 fails or passes the memory test.

A pattern generator 2 outputs patterns (i.e., an input pattern and an expected output pattern) to the test head 1 and simultaneously generates addresses. An address pointer 3 may also be used for generating addresses. A multiplexer 4 selects between the addresses generated by the pattern generator 2 or the addresses generated by the address pointer 3. A failure memory 5 stores failure data obtained from the test head 1 corresponding to the addresses received from the multiplexer 4. A failure bit counter 6 counts the failure bits of the failure memory 5. A controller 7 controls the address pointer 3, the multiplexer 4, the failure memory 5, and the failure bit counter 6. A central processing unit (CPU) 8 controls the pattern generator 2 and the controller 7.

The operation of the conventional testing apparatus generally according to FIG. 1 will now be described further with reference to the operational flowchart for such a conventional testing apparatus provided in FIG. 2. As illustrated in FIG. 2, the CPU 8 sets the level of a power supply voltage to be supplied to the DUT 10 to a predetermined level, such as 3.3 V, in step S11. In response to this voltage setting, the test head 1 will apply the predetermined voltage to the power port(s) of the DUT 10 using a direct current (DC) generator (not shown).

The CPU 8 will then instruct the pattern generator 2 to initiate a function test using a signal A' in step S12. The CPU 8 also informs the controller 7 that the pattern generator 2 has been instructed to initiate the function test. In response, the controller 7 will set the multiplexer 4 to select the addresses generated by the pattern generator 2 and also command the failure memory 5 to perform a write operation.

The pattern generator 2 outputs a background pattern (sometimes also referred to as a rear or initialization pattern) that will write a data value of "1" or "0" into each cell of the memory in order to initialize the individual memory cells with a predetermined state. The format controller FC receives the background pattern from the pattern generator 2, reshapes the background pattern, outputs the reshaped background pattern to the DUT 10 via a driver D, and performs a write operation in step S13.

Once the memory cells have been initialized, during step S14 the pattern generator 2 will generate and output a read/write test pattern and corresponding memory addresses to the format controller FC. The format controller FC will reshape the addresses and the test pattern and output the reshaped addresses and the reshaped input pattern to the DUT 10 via the driver D. The digital comparator DC will receive the resulting output pattern from the DUT 10 via the comparator C and compare the output pattern from the DUT 10 with the expected output pattern received from the pattern generator 2. Based on this comparison, the digital comparator DC will determine whether the DUT 10 has passed or failed the function test and will output failure data as the determination result. The failure data output from the digital comparator DC will be associated within the failure memory 5 to the corresponding address data received from the multiplexer 4. The failure memory 5 typically maintains a once-failed state whereby a memory cell address that has failed to respond correctly to any test pattern will be recorded as a "failed" cell even if it passes other test patterns. In step S15, the pattern generator 2 notifies the CPU 8 that the function test has been completed by using a signal B'.

In step S16, the CPU 8 commands the controller 7 to count the failure bits of the DUT 10. The controller 7 sets the multiplexer 4 to output the address information from the address pointer 3 and commands the failure memory 5 to read the failure data. In step S17, the address pointer 3 sequentially outputs the address of each cell of the failure memory 5 using the multiplexer 4, and the failure bit counter 6 counts the number of failure bits of the failure memory 5. In step S18, the controller 7 notifies the CPU 8 that the counting of the failure bits of the failure memory 5 has been completed in response to an ending signal output from the address pointer 3.

Thereafter, the CPU 8 determines if each of the power supply voltage tests has been completed. If additional supply voltage tests are required, the operation returns to step S11 where the CPU 8 resets the level of the power supply voltage to the next scheduled voltage that will be supplied to the DUT 10 by test head 1. The remaining scheduled voltages may be higher, such as 3.6 V, or lower, such as 3.0 V, than the initial power supply voltage as operational margin tests to aid in the detection of "soft" cell errors. Once the power supply voltage has been reset, steps S12–S18 are performed to complete another functional test cycle on the DUT 10. This sequence of resetting the power supply voltage and rerunning the functional test steps will continue until the CPU 8 determines that functional tests have been run at each of the scheduled voltages and the testing of the DUT 10 is complete.

For example, using the conventional method and apparatus to conduct a series of four functional tests, AC1–AC4 and collect the corresponding failure bit counts FB1–FB4 will involve an operation sequence of:

AC1→FB1→AC2→FB2→AC3→FB3→AC4→FB4.

with each of the operations requiring a certain amount of time to complete. As a result, the cumulative time required to complete the full testing and failure bit counting sequence may be represented by:

$$T_{AC1}+T_{FB1}+T_{AC2}+T_{FB2}+T_{AC3}+T_{FB3}+T_{AC4}+T_{FB4}=\text{Total Test Time.}$$

As described above, in the conventional prior art, the various operational margin tests and the process of counting the defective bits of a memory device under test are performed sequentially. However, as the storage capacity of the memory devices being tested increases, the time and expense required to perform such operational margin tests on the predetermined memory and count the detected failures also increases.

SUMMARY OF THE INVENTION

The present invention provides an exemplary memory testing apparatus and method for operating such an apparatus, that can reduce the time required to test a memory from that required using the conventional memory testing apparatus and methods.

According to an exemplary embodiment of the present invention, there is provided a memory testing apparatus arranged and configured to store the test results for a memory under test in a failure memory and count the failure bits of the failure memory. The exemplary memory testing apparatus includes a pattern generator that can generate background patterns, test patterns, and addresses and will output the test patterns to the memory and simultaneously generates addresses in response to a count ending signal; an address pointer that can generate addresses; a selector, arranged and configured to select either the addresses generated by the pattern generator or the addresses generated by the address pointer and output the selected addresses to the failure memory; and a controller that controls the operation of the selector and the counting of the failure bits of the failure memory, outputs the count ending signal to the pattern generator after counting the failure bits, and simultaneously controls the selector to select the addresses generated by the pattern generator when the pattern generator generates the background pattern.

The pattern generator may include a background pattern commanding unit, which initiates the output of the background pattern to the memory, and a test pattern commanding unit, which initiates outputting the test patterns to the memory when it receives the count ending signal from the controller.

The controller may include a count commanding unit, which commands the failure bits of the failure memory to be counted when the pattern generator generates the background pattern, and outputs the count ending signal to the pattern generator when the counting of the failure bits of the failure memory has been completed.

The present invention also provides an exemplary memory testing method that stores the test results corresponding to a memory under test in a failure memory and counts the failure bits that have been accumulated in the failure memory. The exemplary memory testing method includes the steps of enabling a pattern generator to generate a background pattern and output the background pattern to the memory; enabling a selector to select addresses generated by an address pointer and counting failure bits of the failure memory when the pattern generator generates the background pattern; and enabling the selector to select addresses generated by the pattern generator and allowing the pattern generator to generate test patterns and output to the memory so that the memory can be tested.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
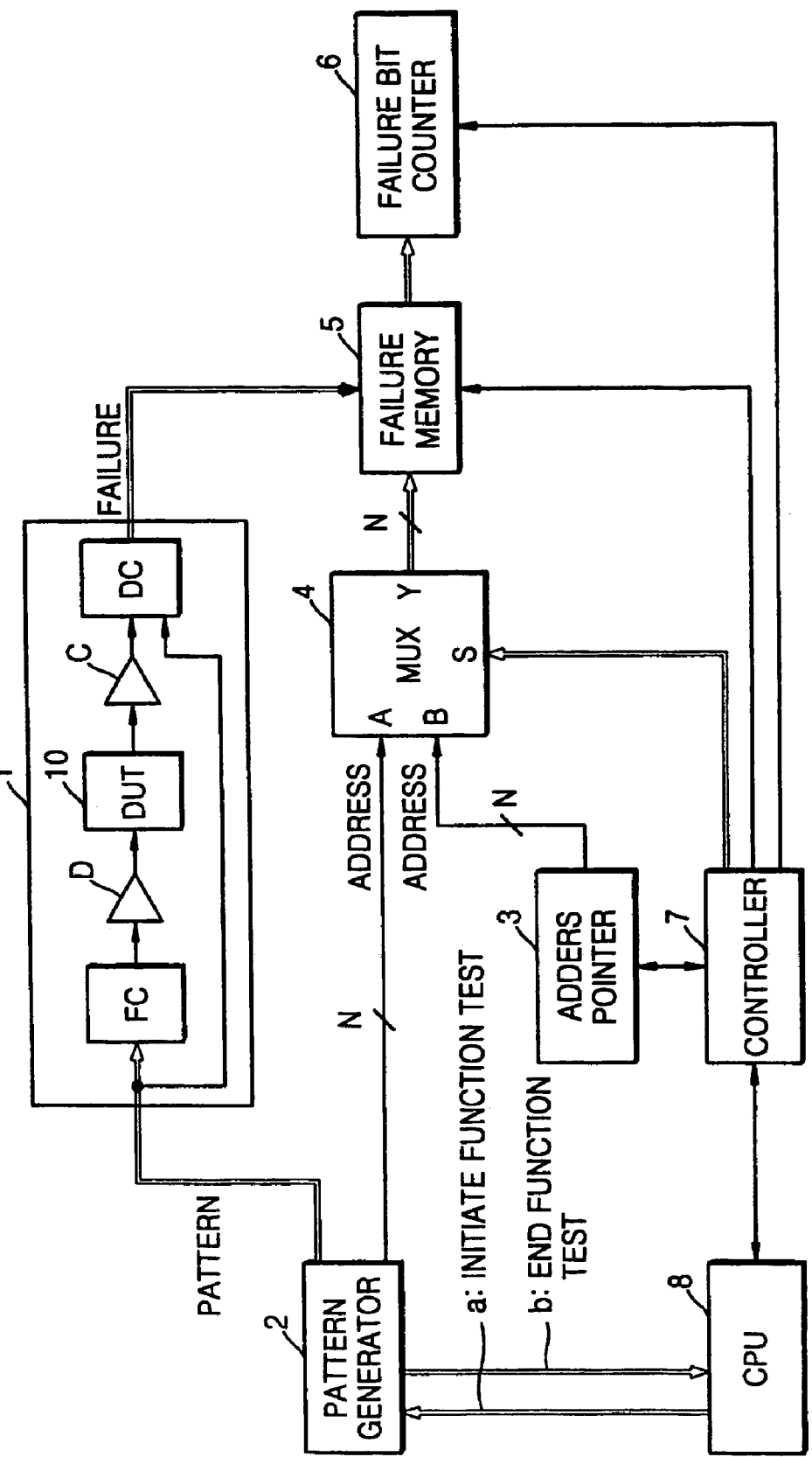
FIG. 1 is a block diagram of a conventional memory testing apparatus.
Figure 2:
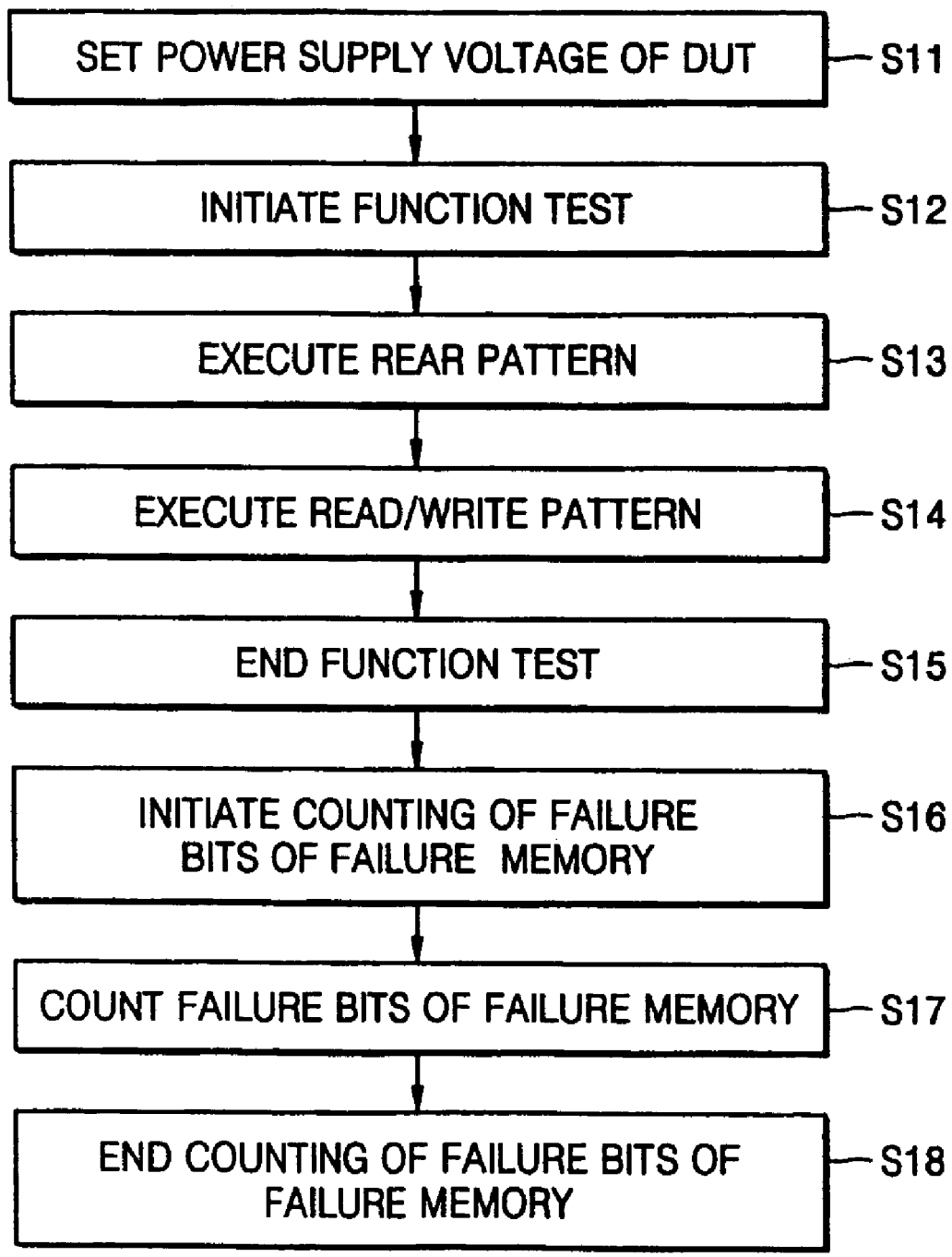
FIG. 2 is a flowchart generally corresponding to a conventional memory testing method.
Figure 3:
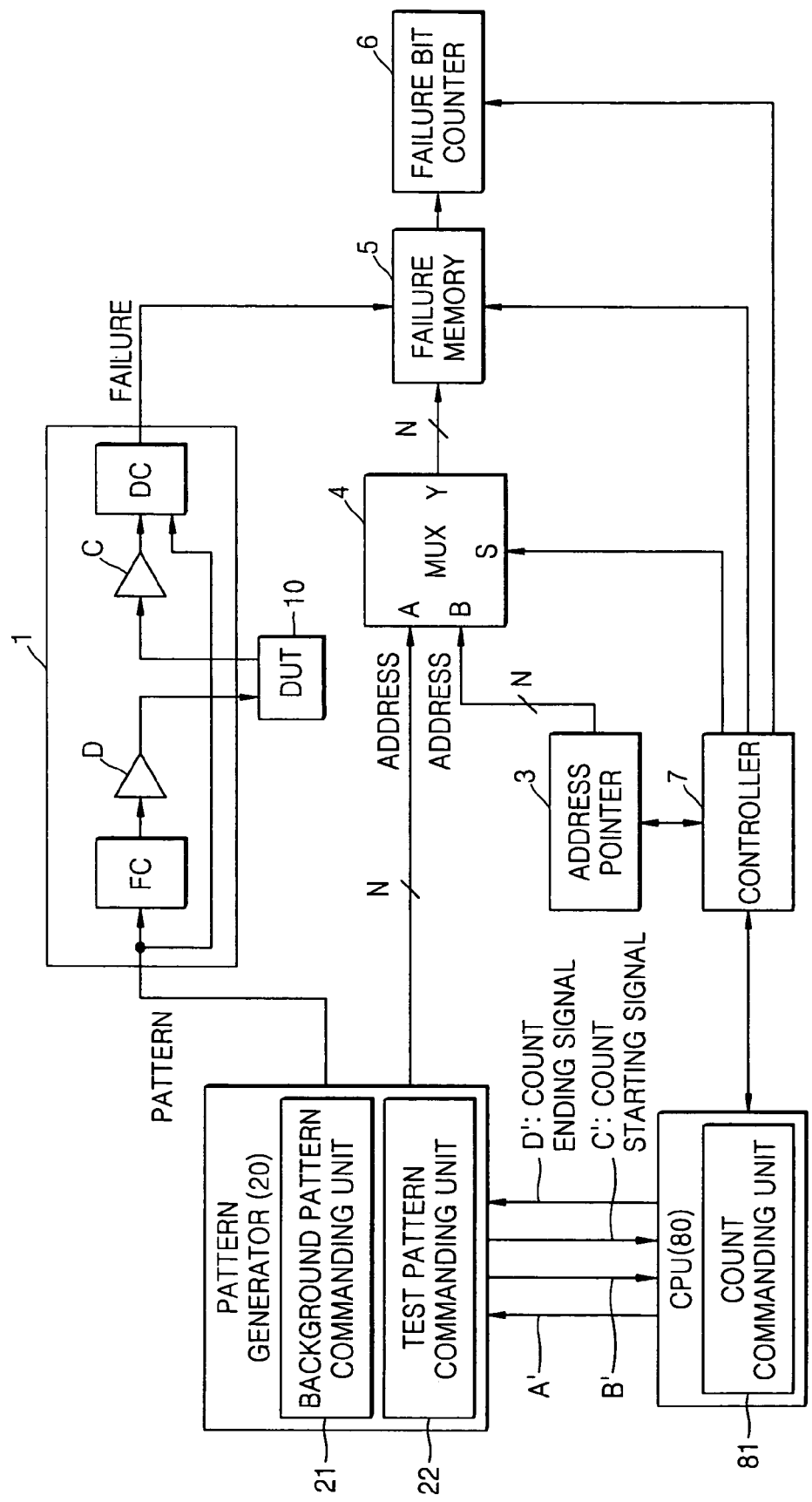
FIG. 3 is a block diagram of a memory testing apparatus according to an embodiment of the present invention.
Figure 5:
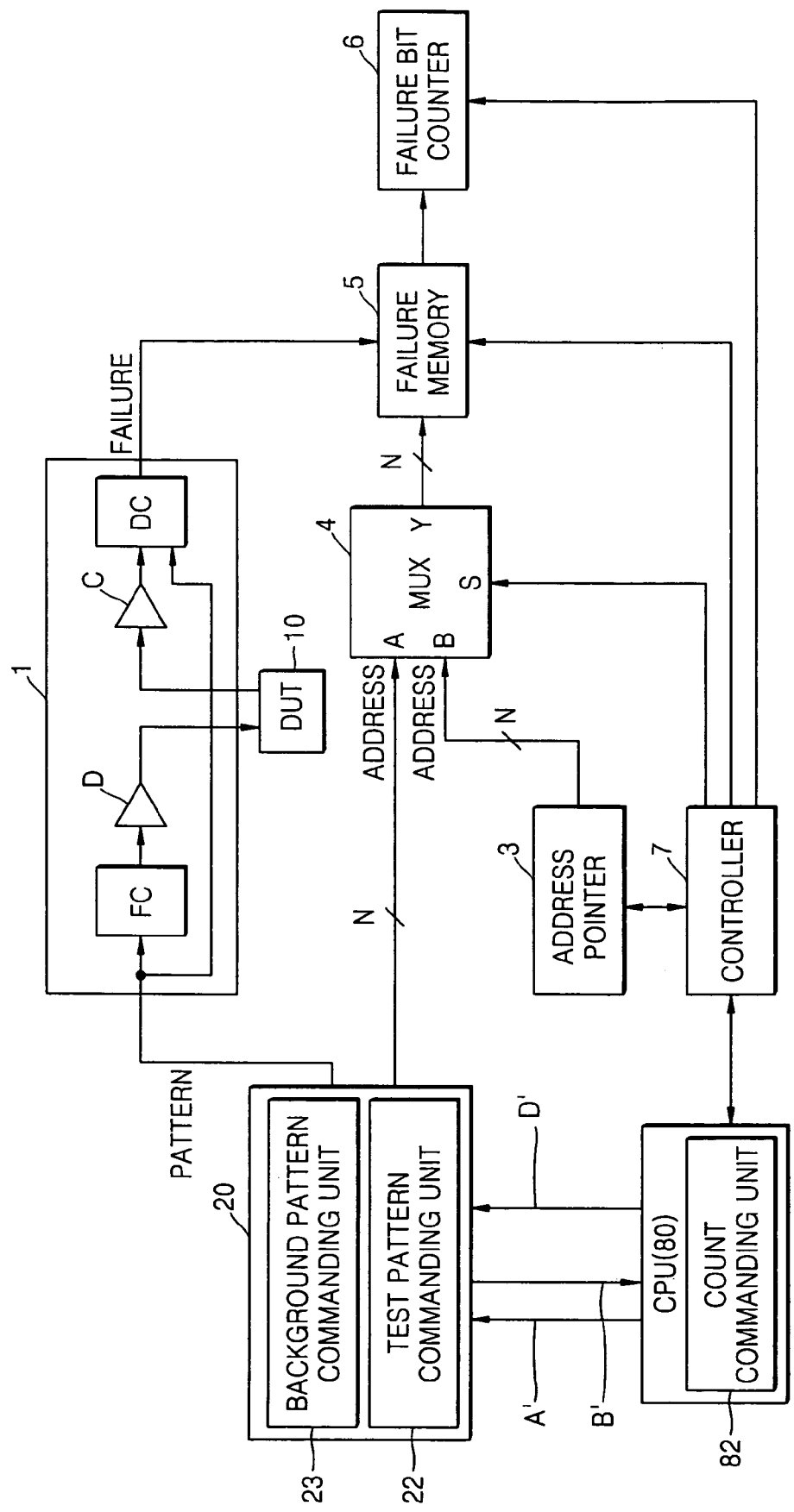
FIG. 5 is a block diagram of a memory testing apparatus according to another embodiment of the present invention.

The present invention will now be described more fully with reference to the accompanying drawings, in which exemplary embodiments of the invention are shown. FIG. 3 is a block diagram of a memory testing apparatus according to an exemplary embodiment of the present invention. In FIGS. 1, 3 and 5, corresponding reference numerals indicate corresponding, if not identical, elements whose descriptions will not be repeated for the sake of brevity.

Referring to FIG. 3, a pattern generator 20, which generally corresponds to the pattern generator 2 of FIG. 1, generates a background pattern to be applied to a memory (hereinafter referred to as a device under test (DUT)) 10 and outputs a count starting signal C'. In addition, the pattern generator 20 generates test patterns, i.e., read/write test patterns, and addresses and outputs the test patterns to the DUT 10 when it receives a count ending signal D'. The pattern generator 20 includes a background pattern commanding unit 21 and a test pattern commanding unit 22. The background pattern commanding unit 21 initiates the output of the background pattern and simultaneously outputs the count starting signal C'. The test pattern commanding unit 22 initiates the output of the test patterns to the DUT 10 in response to the count ending signal D'.

A CPU 80, which generally corresponds to the CPU 8 of FIG. 1, includes a count commanding unit 81. The CPU 80 commands a controller 7 to count the failure bits of a failure memory 5 when the background pattern is generated, and outputs the count ending signal D' to the pattern generator 20 when the counting of the defective bits of the DUT 10 (as recorded in the failure memory) has been completed. More specifically, when the count commanding unit 81 receives the count starting signal C' from the pattern generator 20, it commands the controller 7 to count the defective bits of the DUT 10. When the controller 7 notifies the count commanding unit 81 that the counting of the defective bits of the DUT 10 is complete, the count commanding unit 81 outputs the count ending signal D' to the pattern generator 20.

Figure 4:
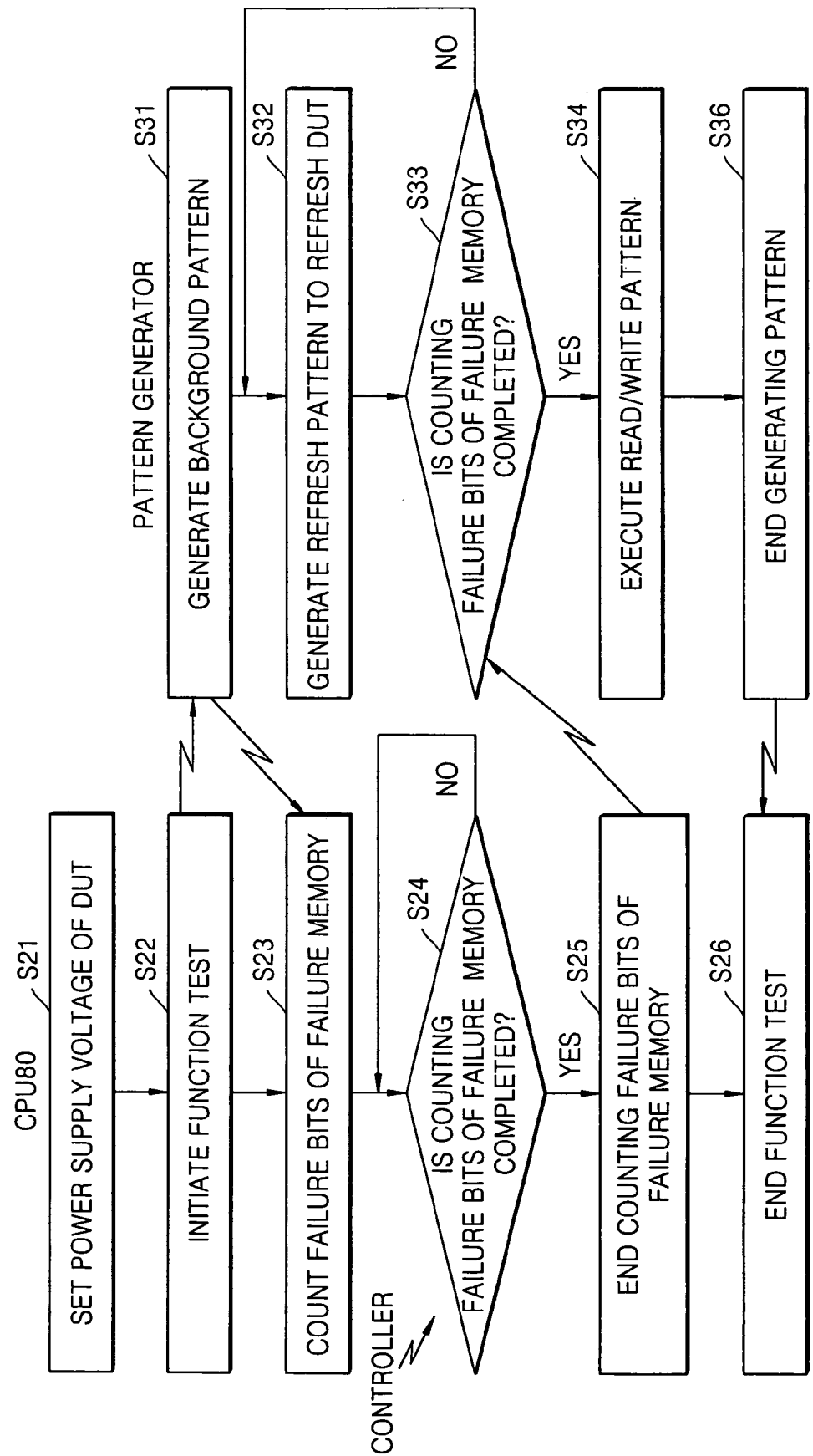
FIG. 4 is a flowchart of the operation of the memory testing apparatus generally corresponding to FIG. 3.

The operation of the memory testing apparatus of FIG. 3 will now be described in greater detail with reference to FIG. 4. FIG. 4 is a flowchart of an exemplary mode of operation of a memory testing apparatus generally corresponding to FIG. 3. Here, it is assumed that the DUT 10 is a dynamic random access memory (DRAM).

In a first round of a memory testing method, the CPU 80 sets the level of a power supply voltage to be supplied to the DUT 10 to an initial voltage, such as 3.3 V, in step S21 so that the test head 1 will apply the predetermined voltage to the power port(s) of the DUT 10 using a DC voltage generator (not shown).

In step S22, the CPU 80 commands the pattern generator 20 to initiate a function test through the output of signal A'.

In step S31, the background pattern commanding unit 21 initiates the output of the background pattern and outputs the count starting signal C' to the CPU 80. A format controller FC receives the background pattern from the pattern generator 20, reshapes the received background pattern, and outputs the reshaped background pattern to the DUT 10 via a driver D.

At this time, the count commanding unit 81 of the CPU 80 receives the count starting signal C' and commands the controller 7 to count the defective bits of the DUT 10 in step S23. Then, the controller 7 controls a multiplexer 4 to select the address pointer 3 as the source of the addresses transmitted to the failure memory 5 and issues a read command to the failure memory. The address pointer 3 sequentially outputs the address of each cell of the failure memory 5 through the multiplexer 4 and the failure bit counter 6 counts the failure bits present in the failure memory 5. The controller 7 receives an ending signal from the address pointer 3 and notifies the CPU 80 that the counting of the failure bits of the failure memory 5 has been completed. The controller 7 then controls the multiplexer 4 to select the addresses generated by the pattern generator 20 as the source of the addresses transmitted to the failure memory 5 and issues a write command to the failure memory.

Until the count commanding unit 81 of the CPU 80 receives the ending signal via the controller 7, it stays in a standby mode in step S24. When the counting of the failure bits of the failure memory 5 has been completed, the count commanding unit 81 outputs the count ending signal D' to the pattern generator 20 in step S25.

In steps S32 and S33, the test pattern commanding unit 22 of the pattern generator 20 generates a refresh pattern and outputs the refresh pattern to the DUT 10 until it receives the count ending signal D' from the CPU 80. Here, the refresh pattern is a pattern for refreshing the DUT 10, i.e., a DRAM. The format controller FC receives the refresh pattern from the pattern generator 20, reshapes the refresh pattern, and outputs the reshaped refresh pattern to the DUT 10 via the driver D to refresh the DUT 10.

When the test pattern commanding unit 22 receives the count ending signal D', it outputs the read/write test pattern and addresses in step S34. The format controller FC reshapes the addresses and the test pattern received from the pattern generator 20, which is one of the read/write test patterns, and outputs the reshaped addresses and the reshaped input pattern to the DUT 10 via the driver D.

The output of the DUT 10 in response to the input received from driver D is input to a digital controller DC via a comparator C. The digital comparator DC generates and outputs failure data by comparing the detected output of the DUT 10 with an expected output pattern corresponding to the read/write test pattern received from the pattern generator 20. The failure data reflecting the performance of the DUT 10 is written on the failure memory 5 at the addresses selected by the multiplexer 4 with the failure memory 5 maintaining a once-failed state. In step S26, the pattern generator 20 notifies the CPU 80 that the functional test can be completed with signal B', and the CPU 80 completes the function test.

Thereafter, in subsequent rounds of the exemplary memory testing method, the CPU 80 resets the level of the power supply voltage to the next predetermined voltage value, such as 3.6 V or 3.0 V, in step S21 and initiate another round of functional testing of the DUT 10 until each of the predetermined power supply voltage levels and/or other operational margin testing inputs have been completed. Other operational margin testing may include variations in, for example, the GND or low voltage levels, the input voltage levels and the output voltage levels.

As described above, in each subsequent round of the memory testing method, while the pattern generator 20 generates the background pattern for initializing the memory device, the failure bits that were detected and accumulated in the failure memory 5 during the previous round of functional testing, are counted, thereby considerably reducing the time taken to test a given DUT 10.

For example, in contrast to the conventional testing sequence described above, utilizing an apparatus and a method according to an exemplary embodiment of the present invention to conduct the same series of four functional tests, AC1–AC4 and collect the corresponding failure bit counts FB1–FB4 will involve an operation sequence of:

$$AC1 \rightarrow (AC2+FB1) \rightarrow (AC3+FB2) \rightarrow (AC4+FB3) \rightarrow FB4.$$

wherein the failure bit counting operation for the preceding functional test is conducted during the "write" portion of the next functional test. Indeed, each of the parenthetical expressions could be expanded to reflect this sequence along the lines of:

$$((AC_{nW+FBn-1})+AC_{nR})$$

in which the W and R subscripts indicate the "write" and "read" operations respectively. As suggested by this expression, the addresses applied to the DUT and the Failure Memory are identical during the "read" operation but may be different during the "write" operation, thereby allowing the Failure Memory to be accessed for the purpose of counting the failure bits as the next test pattern is written into the DUT.

By utilizing the at least partial simultaneous functional testing and failure bit counting, reduces the cumulative time required to complete the full testing and failure bit counting sequence may be represented by:

$$T_{AC1}+T_{AC2}+T_{AC3}+T_{AC4}+T_{FB4}=\text{Total Test Time}.$$

As a result, testing operations conducted according to the exemplary embodiments of the present invention can reduce the total test time by:

$T_{FB1}+T_{FB2}+T_{FB3}$=Total Test Time.

and thereby improve productivity without reducing the thoroughness of the applied testing or allow for additional testing to increase the thoroughness of the functional testing without increasing the required test time. The advantages of utilizing a testing protocol according to the present invention will tend to be even greater as the size and complexity of the DUTs continue to increase.

FIG. 5 is a block diagram of a memory testing apparatus according to another exemplary embodiment of the present invention. As illustrated in FIG. 5, a background pattern commanding unit 23, which generally corresponds to the background pattern commanding unit 21 of FIG. 3, is installed in a pattern generator 20 and initiates outputting a background pattern to a DUT 10. A count commanding unit 82, which generally corresponds to the count commanding unit 81 of FIG. 3, is installed in a CPU 80 and commands a controller 7 to count the failure bits maintained in the failure memory 5, while commanding the pattern generator 20 to perform a functional memory test. In addition, the CPU 80 outputs a count ending signal D' to the pattern generator 20 when the controller 7 notifies the CPU 80 that the counting of the failure bits in the failure memory 5 has been completed.

The operation of the memory testing apparatus of FIG. 5 is very similar to that of the memory testing apparatus of FIG. 3. However, the background pattern commanding unit 23, unlike the background pattern commanding unit 21, does not output the count starting signal C'. In addition, the count commanding unit 82, unlike the count commanding unit 81, does not receive the count starting signal C' from the pattern generator 20 and controls the controller 7 to count the failure bits of the failure memory 5.

The count commanding unit 82 commands the controller 7 to count the failure bits of the failure memory 5 without the help of the count starting signal C' output from the pattern generator 20 of FIG. 3. Therefore, the memory testing apparatus corresponding to FIG. 5 may be able to reduce the testing time required for a given DUT 10 to a level below that required for a memory testing apparatus corresponding to FIG. 3.

As will be appreciated by those skilled in the art, the present invention may be embodied in various configurations and should not, therefore, be considered or interpreted as limited to the detailed embodiments described herein. For example, although in the exemplary embodiments of the present invention, the controller 7 and the CPU 80 are illustrated as separate elements, they could also be integrated into a single controller. In addition, in the exemplary embodiments of the present invention, when the DUT 10 is a DRAM, the pattern generator 20 refreshes the DUT 10 by repeatedly outputting a refresh pattern. However, the pattern generator 20 could just as easily refresh the DUT 10 by repeatedly outputting a background pattern.

According to the present invention, it is possible to reduce the time taken to test a memory by counting failure bits of the memory while a pattern generator generates a background pattern.

What is claimed is:

1. A memory device testing apparatus comprising:
   a pattern generator arranged and configured for selectively generating a background pattern, a test pattern and a first set of addresses;
   an address pointer arranged and configured to generate a second set of addresses;
   a failure memory arranged and configured to accumulate failure data corresponding to the memory device;
   a selector arranged and configured to receive the first set of addresses and the second set of addresses and output a selected set of addresses to the failure memory;
   a failure bit counter arranged and configured to count failing bits stored in the failure data; and
   a control module arranged and configured to coordinate operation of the selector, address pointer, pattern generator, failure memory and failure bit counter, wherein the background pattern can be applied to the memory device while the failure bit counter counts the fail bits in the failure memory.

2. A memory device testing apparatus according to claim 1, wherein:
   the control module is arranged and configured to apply both an initiate function test signal A' and a count ending signal D' to the pattern generator; and
   the pattern generator is arranged and configured to apply both an end function test signal B' and a count starting signal C' to the control module.

3. A memory device testing apparatus according to claim 1, wherein:
   the control module is arranged and configured to apply both an initiate function test signal A' and a count ending signal D' to the pattern generator; and
   the pattern generator is arranged and configured to apply an end function test signal B' to the control module.

4. A memory device testing apparatus according to claim 1, wherein:
   the pattern generator generates and applies the background pattern to the memory device in response to the initiate function test signal A'; and
   generates and applies the test pattern to the memory device and generates and applies the first set of addresses to the selector in response to the count ending signal D'.

5. A memory device testing apparatus according to claim 4, wherein:
   the pattern generator generates and applies the count starting signal C' to the control module while generating and applying the background pattern to the memory device; and
   generates and applies the end function signal B' to the control module after the test pattern has been applied to the memory device.

6. A memory device testing apparatus according to claim 5, wherein:
   the control module, in response to the count starting signal C',
   configures the selector to apply the second set of addresses to the failure memory,
   configures the failure memory to write failure bit data to the failure bit counter, and
   configures the failure bit counter to count failing bits in the failure bit data.

7. A memory device testing apparatus according to claim 6, wherein:
   the control module generates and applies the count ending signal D' when the address pointer signals that the second set of addresses has been generated and applied to the selector.

8. A memory device testing apparatus according to claim 5, wherein:
   the control module, in conjunction with generating and applying the count ending signal D', configures the selector to apply the first set of addresses to the failure memory, and
configures the failure memory to receive and store failure bit data corresponding to the memory device.

9. A memory device testing apparatus according to claim 1, wherein the pattern generator further comprises:
a background pattern commanding unit, which controls output of the background pattern to the memory device; and
a test pattern commanding unit, which controls output of the test pattern to the memory device, the test pattern being output to the memory device after the count ending signal D' is received by the pattern generator.

10. A memory device testing apparatus according to claim 1, wherein:
the control module includes a count commanding unit, the count commanding unit causing failure bits in the failure memory to be counted while the pattern generator generates the background pattern, and generating and applying the count ending signal D' to the pattern generator when the failure bits have been counted.

11. A method of testing a memory device comprising:
applying a test pattern to the memory device;
identifying failing bits in the memory device;
accumulating failure data corresponding to the failing bits;
counting the failing bits; and
applying a background pattern to the memory device, wherein the steps of counting the failing bits and applying the background pattern are performed substantially simultaneously.

12. A method of testing a memory device according to claim 11, wherein:
identifying the failing bits includes
sensing an output of the memory device resulting from application of the test pattern;
comparing the output to an anticipated output to identify the failing bits.

13. A method of testing a memory device according to claim 12, wherein:
accumulating the failure data includes
storing data reflecting the identified failing bits in a failure memory; and
counting the failing bits includes
transferring the failure data from the failure memory to a failure bit counter.

14. A method of testing a memory device according to claim 13, wherein:
storing the failure data in the failure memory includes
reading output data from a digital comparator and storing the output data according to address information provided by a pattern generator.

15. A method of testing a memory device according to claim 13, wherein:
transferring the failure data from the failure memory includes
outputting the failure data from the failure memory according to address information provided by an address pointer.

16. A method of testing a memory device according to claim 11, further comprising:
enabling a pattern generator to generate the background pattern and output the background pattern to the memory device;
enabling an address pointer to generate address information; and setting a selector to output the address information generated by the address pointer when counting the failing bits, wherein the background pattern is generated while the failing bits are counted.

17. A method of testing a memory device according to claim 16, further comprising:
enabling a pattern generator to generate the test pattern and address information,
outputting the test pattern to the memory device and to a digital comparator;
outputting the address information to the selector; and
setting the selector to output the addresses information generated by the pattern generator when accumulating the failure data.

18. A method of testing a memory device according to claim 17, wherein:
the step of outputting the test pattern to the memory device is not performed while the failing bits are being counted.

19. A method of testing a memory device comprising:
generating a background pattern within a pattern generator in response to an initiate function test signal A' and applying the background pattern to the memory device;
generating a first address sequence within an address pointer in response to a start count signal C' and applying the first address sequence to a failure memory;
outputting failure data from the failure memory to a failure bit counter according to the first address sequence;
generating a count end signal D' when the failure data has been transferred to the failure bit counter;
generating a test pattern and a second address sequence within a pattern generator in response to the count end signal D';
applying the test pattern to the memory device to identify failing bits;
accumulating failure data corresponding to the failing bits in the failure memory according to the second address sequence; and
generating a functional test end signal B' when the test pattern has been completed.

20. A method of sequentially performing N functional tests on a memory device comprising:
a) generating a first background pattern within a pattern generator in response to an initiate function test signal A' and applying the first background pattern to the memory device to prepare an initialized memory device;
b) generating a first test pattern and a first address sequence within the pattern generator and writing the first test pattern to the initialized memory device using the first address sequence to form a first memory device pattern within the memory device;
c) reading the first memory device pattern from the memory device using the first address sequence and comparing the first memory device pattern with the first test pattern to identify first failing bits;
d) storing data corresponding to the identified failing bits within a failure memory using the first address sequence to accumulate failure bit data;
e) generating a next background pattern within the pattern generator and applying the next background pattern to the memory device to prepare a reinitialized memory device;
f) generating a next test pattern and a next address sequence within the pattern generator and writing the next test pattern to the reinitialized memory device using the next address sequence to form a next memory device pattern within the memory device;
g) generating a second address sequence within an address pointer in response to a start count signal C' and outputting the failure bit data from the failure memory to a failure bit counter according to the second address sequence, wherein the failure bit data is output while the next test pattern is being written to the memory device;
h) generating a count end signal D' when the failure bit data has been transferred to the failure bit counter;
i) reading the next memory device pattern from the memory device using the next address sequence and comparing the next memory device pattern with the next test pattern to identify next failing bits;
j) storing data corresponding to the identified failing bits within the failure memory using the next address sequence to accumulate failure bit data;
k) repeating steps e) through j) N–2 times to complete N functional tests of the memory device;
l) generating an $N^{th}$ address sequence within an address pointer in response to a start count signal C' and outputting failing bit data from the failure memory to the failure bit counter according to the $N^{th}$ address sequence; and
m) generating a functional test end signal B' when the failing bit data has been counted.

* * * * *